(12) United States Patent
Chen et al.

(10) Patent No.: US 7,978,014 B2
(45) Date of Patent: Jul. 12, 2011

(54) DIGITAL FAST-LOCKING FREQUENCY SYNTHESIZER

(75) Inventors: Wei-Zen Chen, Hsinchu (TW); Song-Yu Yang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 191 days.

(21) Appl. No.: 12/404,588

(22) Filed: Mar. 16, 2009

(65) Prior Publication Data
US 2010/0039183 A1 Feb. 18, 2010

(30) Foreign Application Priority Data
Aug. 15, 2008 (TW) ................................ 97131136 A

(51) Int. Cl.
*H03L 7/00* (2006.01)
(52) U.S. Cl. ............. 331/16; 331/1 A; 331/25; 327/156; 327/159
(58) Field of Classification Search .................. 331/1 A, 331/16, 25; 375/372, 376; 327/156, 159
See application file for complete search history.

(56) References Cited

U.S. PATENT DOCUMENTS

| | | | |
|---|---|---|---|
| 6,809,598 B1 * | 10/2004 | Staszewski et al. | 331/16 |
| 7,279,988 B1 | 10/2007 | Janesch et al. | |
| 7,358,820 B2 * | 4/2008 | Da Dalt | 331/16 |
| 7,573,955 B2 * | 8/2009 | Gazsi | 375/327 |
| 7,592,874 B2 * | 9/2009 | Wicpalek et al. | 331/25 |
| 2006/0140322 A1 * | 6/2006 | Johnson et al. | 375/376 |

FOREIGN PATENT DOCUMENTS

| TW | 400672 | 8/2000 |
|---|---|---|
| TW | 1279085 | 4/2007 |

OTHER PUBLICATIONS

In-Chul Hwang, Sang-Hun Song, Soo-Won Kim; A Digitally Controlled Phase-Locked Loop With a Digital Phase-Frequency Detector for Fast Acquisition; IEEE Journal of Solid-State Circuits, vol. 36, No. 10, Oct. 2001; p. 1574-1581.

* cited by examiner

*Primary Examiner* — Joseph Chang
*Assistant Examiner* — Jeffrey Shin
(74) *Attorney, Agent, or Firm* — WPAT, PC; Justin King

(57) ABSTRACT

A digital PLL frequency synthesizer characterized by fast-locking and low-jitters is presented. The PLL comprises a phase detector, a controllable oscillator, a loop filter having an automatically-adjusted loop gain, a feedback phase integration circuit, and a reference phase integration circuit. Fast-locking is achieved by dynamically adjusting forward-path gain and integral-path gain according to the output of the phase detector and the output of the integral-path during phase tracking. A skew-compensated counter circuit is proposed, which incorporates an asynchronous counter, a data register and a sample phase generator and features high-speed and low-power operation.

10 Claims, 8 Drawing Sheets

DIGITAL FAST-LOCKING FREQUENCY SYNTHESIZER

BACKGROUND OF THE INVENTION

1. Field of the Invention

The present invention relates to a digital PLL frequency synthesizer, more particularly to, a digital PLL frequency synthesizer characterized by fast locking and low jitters.

2. Description of the Prior Arts

With rapid advance of deep sub-micron CMOS technology, the conventional PLL suffers from dropping supply voltage, smaller operating range, design complexity, and difficulty regarding to its die size shrink. For the conventional PLL, there exists a trade-off between the lock-in time and the output jitter; namely, it is very difficult to achieve fast locking and low jitters at the same time. Hence, the digital PLL design plays a major role in the recent PLL implementation.

The conventional digital PLL frequency synthesizer is depicted in FIG. 1.

As suggested in R.O.C. Patent I279085, the loop filter and the voltage-controlled oscillator in the conventional charge pump PLL are replaced by digital circuits, wherein the output phase information of a phase frequency detector 120 is sampled and quantized; due to the limited range of the oscillating frequency of a oscillator 150, therefore, there exist a lot of quantization errors and a dead zone is invited so as unable to locking quickly and at the same time said 150 will be affected by the jitter characteristics at output side. Accordingly, in view of the above drawbacks as the foregoing, it is an imperative that a digital PLL frequency synthesizer, particularly, a digital PLL frequency synthesizer characterized in fast locking and low jitters is designed so as to improve the poor state of quantization error as disclosed in the conventional art.

SUMMARY OF THE INVENTION

In view of the disadvantages of prior arts, the primary object of the present invention relates to a digital PLL frequency synthesizer, for generating a controlling signal for controlling an oscillator by using a loop filter circuit for automatically and dynamically adjusting a loop gain, during the locking process of the loop filter, loop parameters are automatically adjusted so as to achieve the purpose of high-speed locking and low phase jitters.

According to one aspect of the present invention, the present invention further relates to a fast locking method for a digital synthesizer.

According to another aspect of the present invention, the present invention further relates to a locking state detecting circuit.

Said digital PLL frequency synthesizer comprises: a loop filter with an automatically-adjusted loop gain, for generating a control signal, and automatically adjusting loop parameters during the PLL locking procedure; a controllable oscillator, coupled to said loop filter, for generating a corresponding oscillating frequency according to said control signal; a feedback phase integration circuit, coupled to said controllable oscillator, for estimating the phase information of said controllable oscillator; a reference phase integration circuit, for generating reference phase information; and a phase detector, coupled to said loop filter, said feedback phase integration circuit, and said reference phase integration circuit, for comparing the error between the phase of said controllable oscillator and said reference phase.

A method of fast locking said synthesizer comprises the steps of:

in the initial phase of locking procedure, setting the adjustable magnification device on said forward-path to be a predetermined magnification;

setting the adjustable magnification device on said integral-path to be zero;

changing the synthesizer's state to be the second stage when the output of said phase detector is within a predetermined range;

setting the adjustable magnification device at said forward-path circuit to be a predetermined magnification $\beta_0$;

setting the adjustable magnification device at said integral-path circuit to be another predetermined magnification $\alpha_0$;

detecting the output $\Phi$ of the said integral-path circuit;

recording the average of the adjacent local maximum value and local minimum value to obtain a decision value $\Phi_{avg}$;

when a difference between the contiguous decision values is smaller than a first critical value $\lambda_1$, and a difference between the present output $\Phi$ of the integral-path circuit and the present $\Phi_{avg}$ is smaller than a second critical value $\lambda_2$, then setting the locking state control circuit to be another state to generate the control signal to decrease the gain of the adjustable magnification device at feed-forward path and the gain of the adjustable magnification device at integral-path and the critical values $\lambda_1$ and $\lambda_2$ are changed accordingly; and if the procedure keeps unaltered, the locking state control circuit keeps on generating the control signal, to decrease the gain of the adjustable magnification device at forward-path and the gain of the adjustable magnification device at integral-path and the critical values $\lambda_1$ and $\lambda_2$ are changed accordingly until the gain of the adjustable magnification device at forward-path and the gain of the adjustable magnification device at integral-path are less then the predetermined values ($\beta_{min}$, $\alpha_{min}$).

Said locking state detecting circuit, coupled to an output of an integral-path, comprises: a peak detecting circuit, coupled to said output of the integral-path, for recording the peak value of said output of the integral-path; a trough detecting circuit, coupled to said output of the integral-path, for recording the trough value of said output of the integral-path; a mean circuit, coupled to the output of said peak detecting circuit and that of the trough detecting circuit, for dividing the sum of the output of said peak detecting circuit and that of the trough detecting circuit by two to get an average of them; a differencing circuit, coupled to said mean circuit, for comparing the difference of the outputs of said mean circuit at the contiguous interval; an integral-path value comparing circuit, coupled to said mean circuit and said integral-path, for comparing a difference between a present integral-path value and the mean circuit outputted value, if the absolute value of said difference is smaller than a predetermined first gate value, then a first decision signal is given; and a mean comparing circuit, coupled to said differencing circuit, for comparing the absolute value of the output of said differencing circuit, if the absolute value thereof is smaller than a predetermined second gate value, then a second decision signal is given.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become readily understood from the detailed description given herein below and the accompanying drawings which are given by way of illustration only, and thus are not limitative of the present invention and wherein.

DESCRIPTION OF THE EXEMPLARY EMBODIMENTS

The following descriptions are of exemplary embodiments only, and are not intended to limit the scope, applicability, or configuration of the invention in any way. Rather, the following description provides a convenient illustration for implementing exemplary embodiments of the invention. Various changes to the described embodiments may be made in the function and arrangement of the elements described. For your esteemed members of reviewing committee to further understand and recognize the fulfilled functions and structural characteristics of the invention, several exemplary embodiments cooperating with detailed description are presented as the follows.

Figure 1:
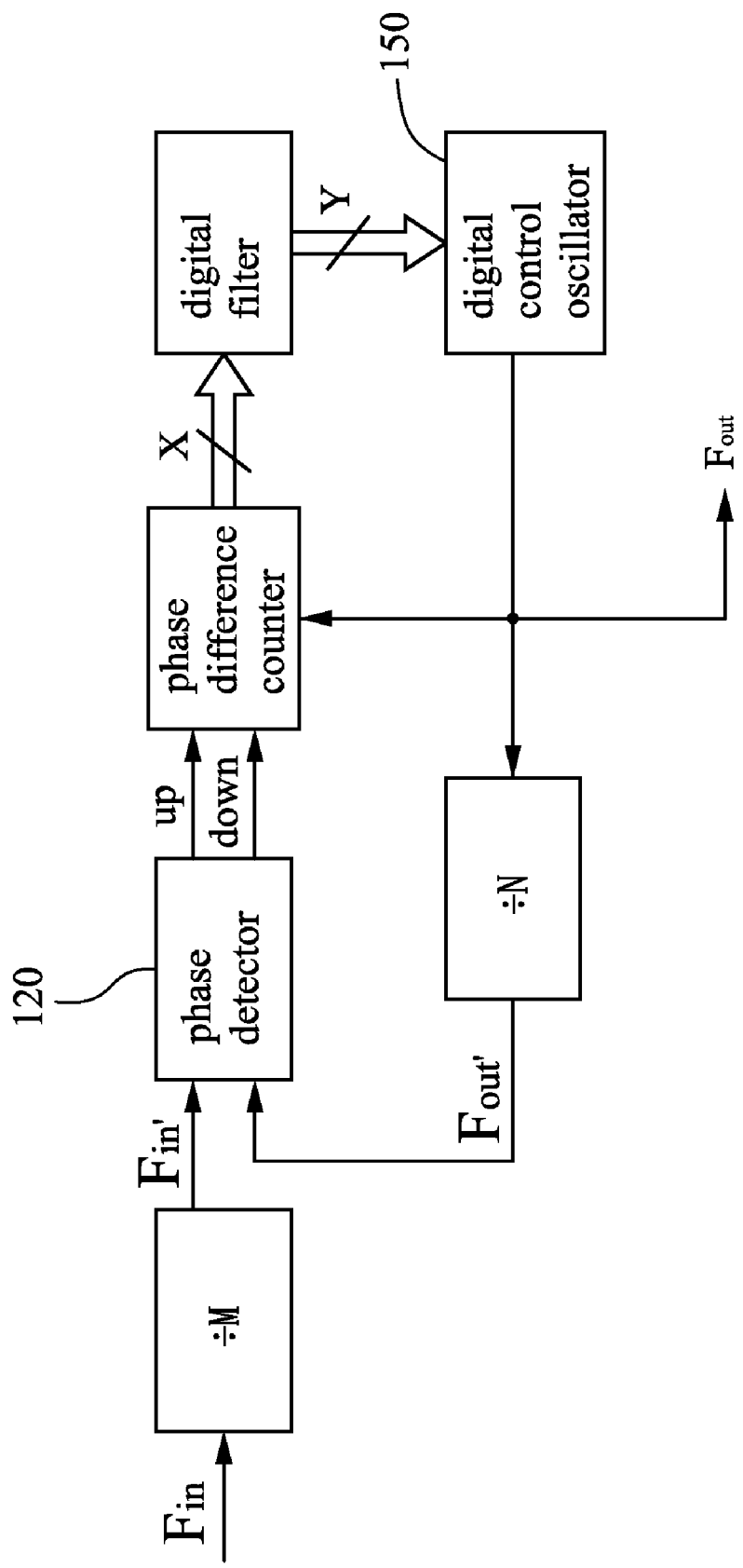
FIG. 1 relates to a diagram of a prior art according to the present invention.
Figure 2:
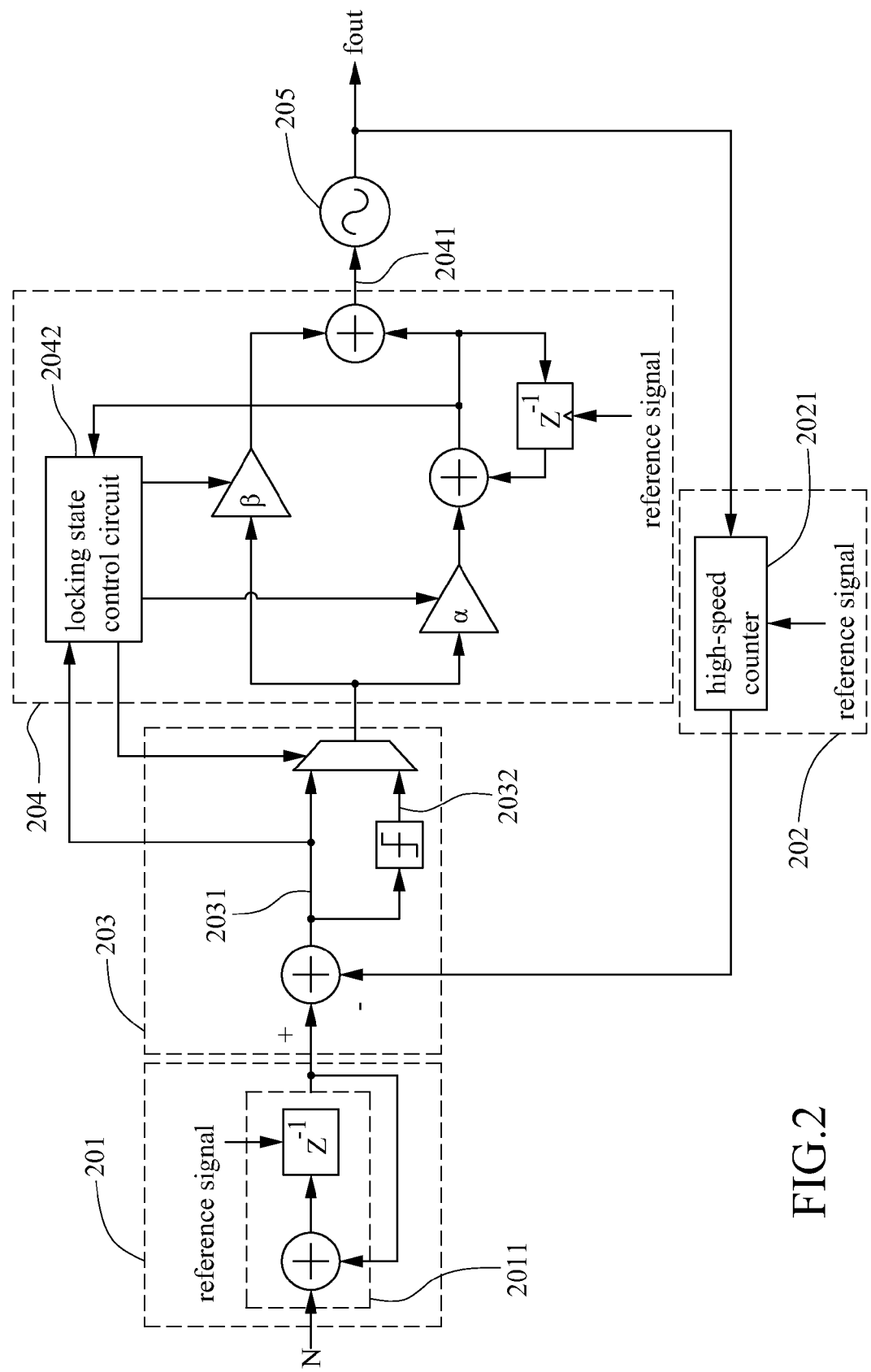
FIG. 2 relates to one of the preferred embodiments according to the present invention.

FIG. 2 relates to a preferred embodiment of the present invention. In the present embodiment, a PLL comprises a reference phase integration circuit 201, a feedback phase integration circuit 202, a phase detector 203, a loop filter 204, and a controllable oscillator 205. During the operation of the circuit, a frequency control code N is to be set up, and while the loop is locked, the frequency magnification of the output clock signal frequency will be N times of the input reference frequency $f_{ref}$, namely, there exists a relation between the reference frequency and the frequency fout of the output signal OUT such as fout=$f_{ref}$*N.

In the present embodiment, said reference phase integration circuit 201 is composed of an accumulator 2011. At the time of arrival of each reference signal REF rising edge arriving, the frequency control code N will be accumulated once so as to output the summation the frequency control code and the previously accumulated result, therefore, the outputted summation can present a idealistic reference phase value; and said feedback phase integrator 202 is coupled to the backside of said controllable oscillator 205, at the time of the arrival of the rising edge outputted from each digital control oscillator 205, the high-speed counter 2021 in the integrator 202 will add 1 to the present value, therefore, the outputted result is equivalent to the phase information of the feedback signal. Respectively, the size of the idealistic phase information and that of the present phase information of the oscillator are calculated and said phase detector 203 carries out the mutual subtraction of the sizes such that a digitalized phase error information quantity 2031 is obtained.

Said quantity 2031 is subsequently being forwarded to the loop filter 204 for filtering, and then a control signal 2041 is generated to adjust said controllable oscillator 205, and then again the output of said 205 was sent to the circuit 202 to complete the feedback loop. Since the resolution of said phase detector 203 is decided by the signal period outputted from said controllable oscillator, certain quantity error exists and an additional quantization noise will be introduced and a Dead Zone comes into being so as to increase the outputted phase jitters. As a result the loop locking procedure is divided into two stages. At the first stage, the output of said phase detector 203 is the difference ($\epsilon_1$) 2031 between said circuit 201 and said circuit 202. At the second stage, the output of said phase detector 203 is the polarity of the difference between said circuit 201 and said circuit 202, that is, said difference ($\epsilon_1$) 2031 between said circuit 201 and said circuit 202 is quantized to a single-bit binary output ($\epsilon_2$) 2032, only the polarity of $\epsilon_1$ is compared as positive 1 or negative 1 so as to achieve a binary phase detection function.

The locking procedure is further illustrated as the follows. At the first stage, a locking procedure state control circuit 2042 in said loop filter 204 sets up the gain α of the integral-path inside the filter 204 to be zero, the gain β of the feed-forward path inside the filter 204 to be a predetermined value $\beta_0$ and monitors the output value $\epsilon_1$ of said phase detector. When the loop approaches steady-state, the output $\epsilon_1$ of said phase detector 203 will be fluctuating between two contiguous values and under this situation said circuit 2042 will enter the second stage.

Figure 3:
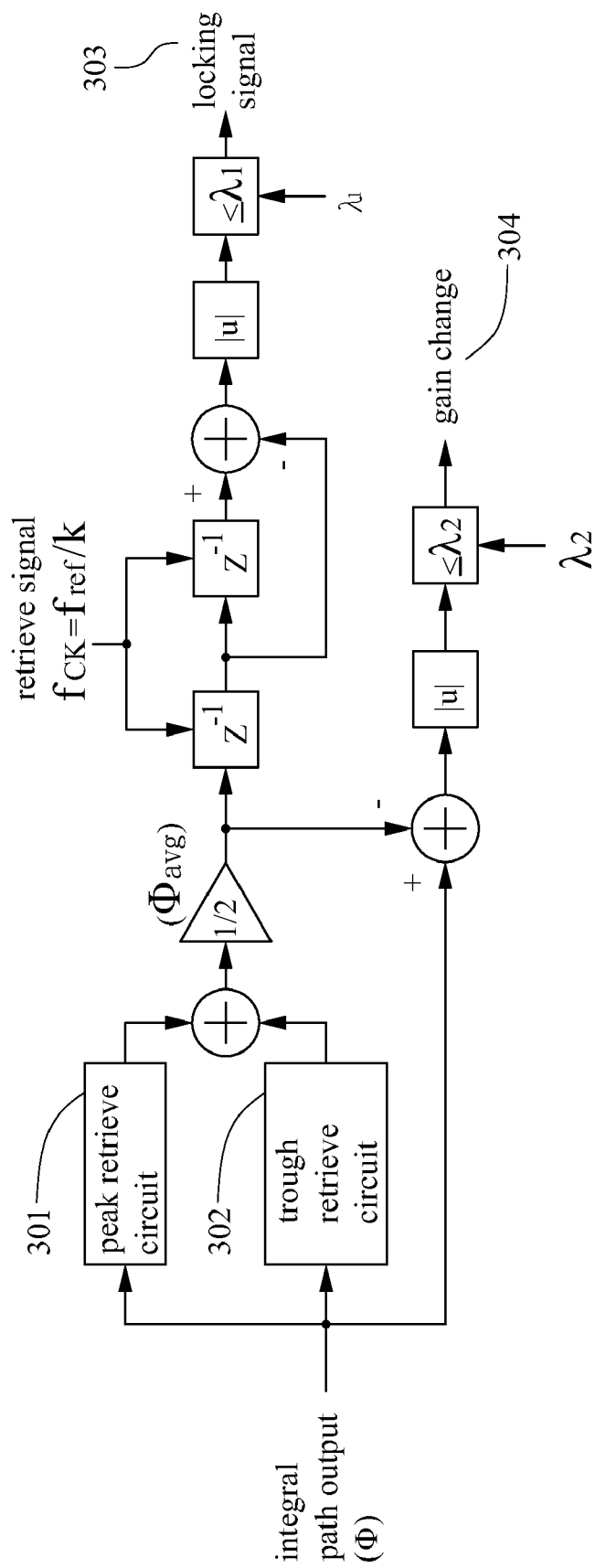
FIG. 3 relates to a diagram of the detecting mechanism according to the present invention.

While entering the second stage, said circuit 2042 will detect the output of the integral-path, and adjust the gain α of the integral path and the gain β of the feed-forward path to accelerate the locking procedure and decrease the output jitters after locking. Wherein the detection mechanism is illustrated in FIG. 3, the output of the integral path will be processed by a peak retrieve circuit 301 and by a trough retrieve circuit 302 so as to average the outcomes to be a mean $\Phi_{avg}$. Said $\Phi_{avg}$ is retrieved by a retrieve signal CK, and when the difference between the contiguous means $\Phi_{avg}$ is smaller than or equals to a critical value $\lambda_1$, a locking signal 303 will be sent. Meanwhile, said circuit 2042 will compare the present integral-path output value Φ and the mean $\Phi_{avg}$ between said peak and said trough. When the difference between said Φ and said $\Phi_{avg}$ is smaller than a predetermined critical value $\lambda_2$, a gain change signal 304 will be asserted. The system will base upon said signal 303 and said signal 304 to determine α-β and the critical values $\lambda_1$-$\lambda_2$.

Figure 4:
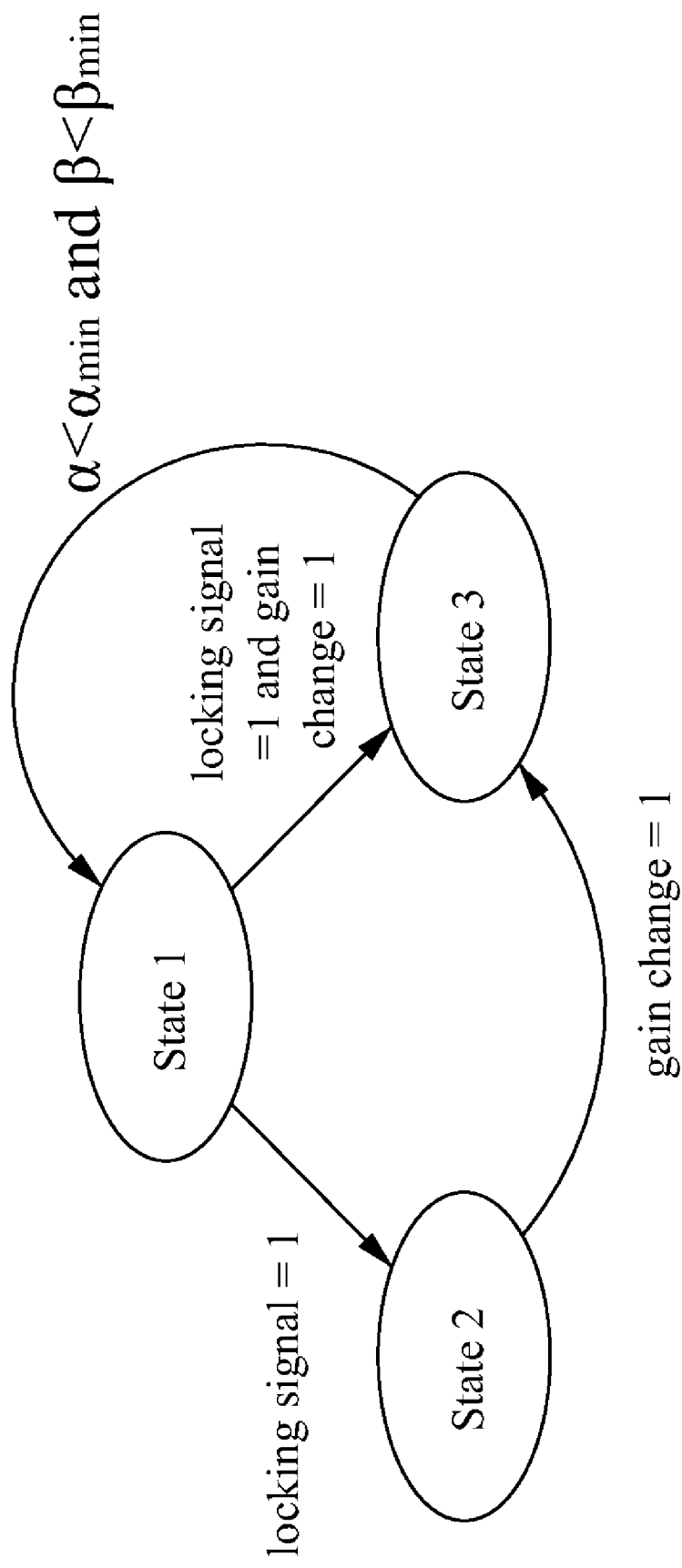
FIG. 4 relates to a diagram of judge logic state according to the present invention.
Figure 5:
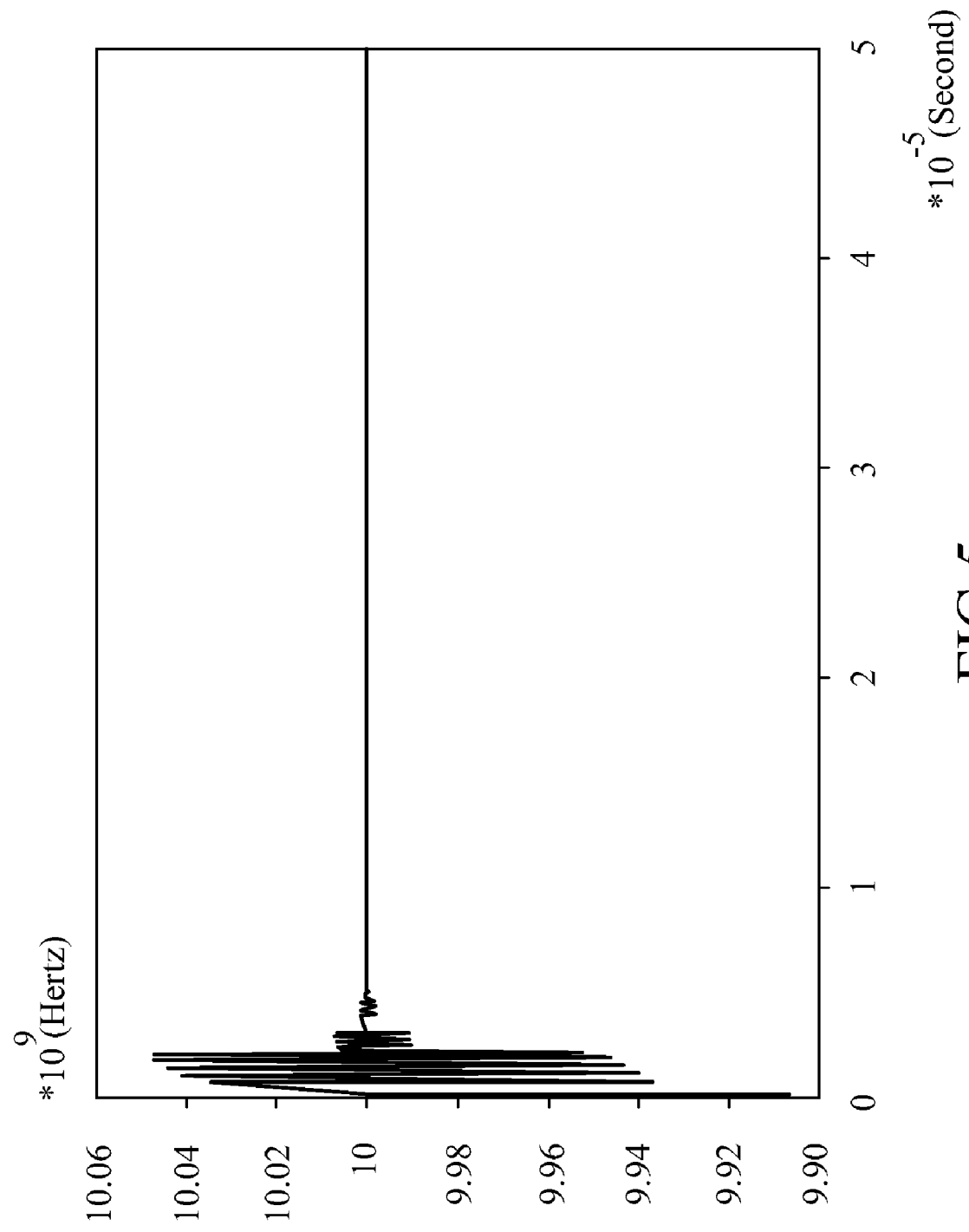
FIG. 5 relates to a plot of the simulation result according to the present invention.

FIG. 4 illustrates the logic state diagram of switching said feed-forward path gain β, said integral-path gain α, and critical values $\lambda_1$-$\lambda_2$, and the logic state illustrated in said diagram was initialized from a state 1. When the locking signal and the gain change signal as illustrated in FIG. 3 satisfy the logical judgment in FIG. 4, then a state 3 is entered so as to set said gain β or said gain α to be changed to lessen the gain and change simultaneously the critical values $\lambda_1$-$\lambda_2$ at the time of judgment. At the time of change of the gains α-β, the system goes back to said state 1 and detects again, and in case of the aforesaid judge condition, then the gains α-β will decrease again and then the critical values $\lambda_1$-$\lambda_2$ will be changed again and this process will keep on moving until the gains α-β is smaller than a predetermined values $\alpha_{min}$-$\beta_{min}$.

The main structure for said integration circuit 202 on the feedback loop is a high-speed counter 2021. For said counter 2021, there are two types of realizations such as a synchronous counter or an asynchronous counter. In the design of said synchronous counter, every Flip Flop is controlled by a single clock signal. Therefore, while said synchronous counter circuit operating in a very high speed, each of said Flip-Flops will be operating in the same speed and introduce high power consumption. Additionally, the bottleneck of the operating speed of said synchronous counter locates at the carry signal propagation time, therefore, while the length of the counter is increasing, the maximum operation speed of the circuit is lower. The main structure for an asynchronous counter, however, is a multiple-stage dividing-by-2 circuit connected in serial, every Flip Flop is controlled by its prior stage divided-by-2 circuit, therefore, as the stages increase, the later Flip Flops are operating at a lower frequency to consume less power and are devoid of the carry propagation delay as the synchronous counter suggested. However, in the asynchronous counter, since each stage does not share the same clock signal driving, there exists time propagation between the outputs of each stage. As the serial stages increase, said time propagation delay or timing skew will increase accordingly to introduce the difficulties to retrieve the data.

Figure 6:
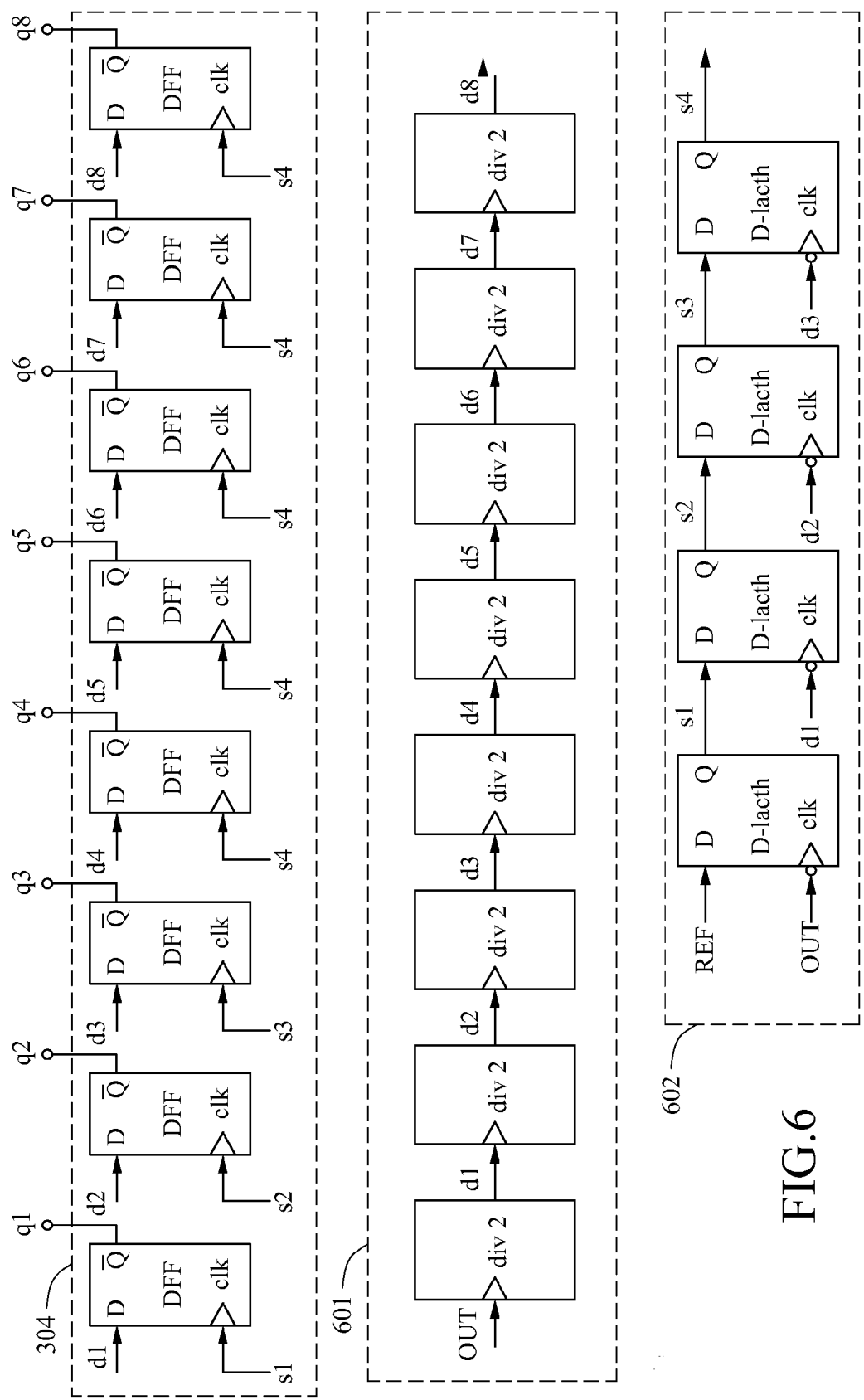
FIG. 6 relates to a circuit structure diagram of the high-speed counter according to the present invention.

The circuit structure of the high-speed counter is illustrated in FIG. 6, wherein said counter is principally composed of an asynchronous counter. Since the counter is asynchronous, at the time of retrieving data, if the reference signal REF is readily utilized to sample each bit output d1~d8 of a counter 601, that is, to use the same sampling phase to sample each bit output of said counter 601, then the delay between each bit output will lead to an incorrect outcome. To overcome the foregoing drawbacks, a sampling phase generator 602 is used in the present embodiment to generate respective bit corresponding to sampling phases s1~s4, and these sampling phases are used to sampling said asynchronous counter 602 to obtain the correct value. The major operating principle is stated as the follows: Because the change of the state of every bit of the counter 601 is triggered by the rising edge of the prior bit, (for example, the change of the state of d2 is triggered by the rising edge of d1), the correct time interval for each bit to be outputted is before the arrival of the deciding retrieving signal (in the present embodiment it is REF) but thereafter the LSB causes a serial of state changes to invite the rising edge event of the prior bit output until next time the rising edge event of the prior bit output happens again, as a result as long as during the period of time a sampling signal can be generated to sample the bit output then a correct output can be obtained.

Figure 7:
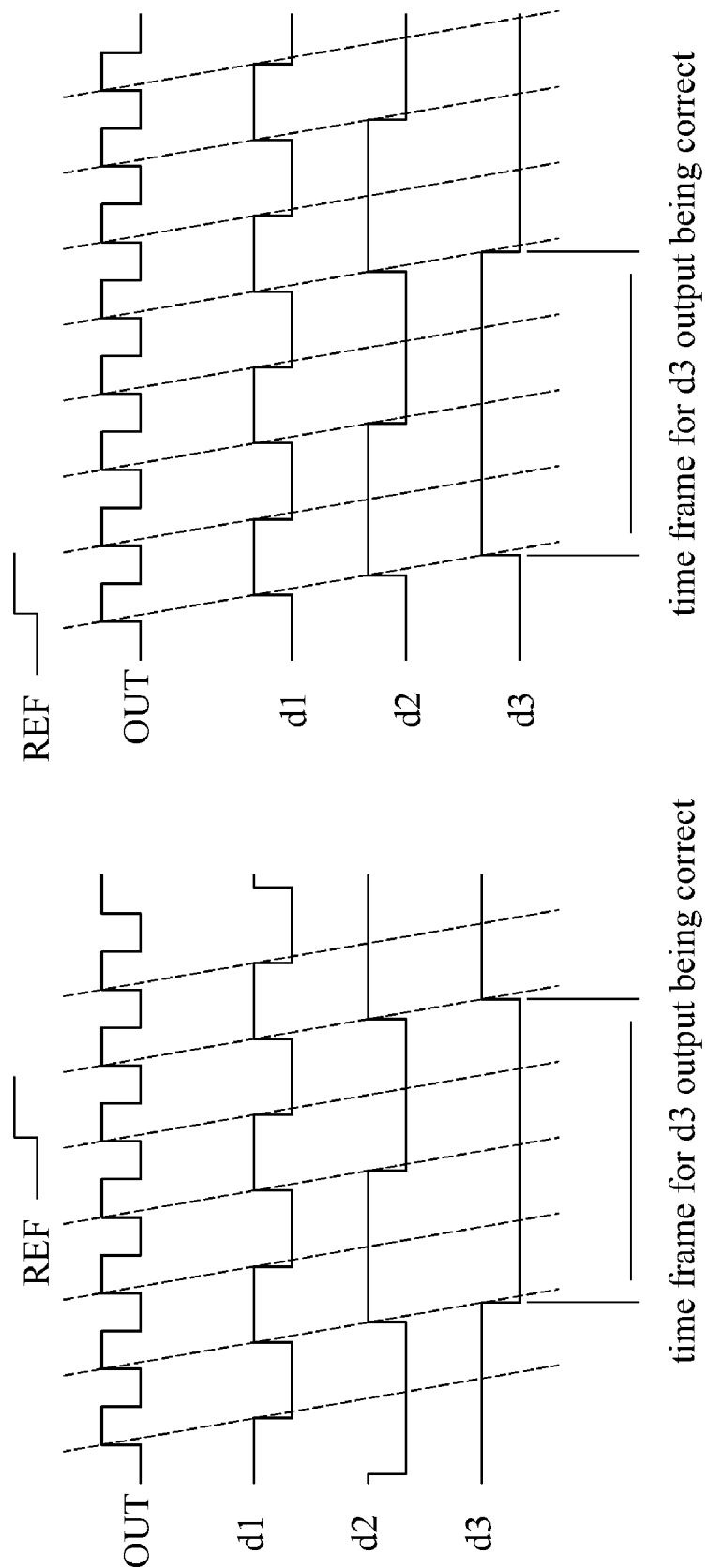
FIG. 7 relates to a diagram according to a decision retrieving signal and the correct time-interval output of the asynchronous counter.

FIG. 7 illustrates two examples of the aforesaid process, wherein the signal determining to fetch the data is set to be REF signal. In accordance with the bit output d3, in these two examples, the correct values for d3 are 0 and 1 respectively, and the period for the values to be valid is shown in FIG. 7. If the valid d3 output value is desirable, a sampling phase within this duration must be generated to sample d3. In this embodiment, with a sampling phase generating circuit 602 which is composed of a serial of negative edge trigger D-latches, the bit outputs of said counter 601 are detected and the corresponding sampling phase s1~s4 are generated to sample the outputs d1~d8 of said counter 601. In view of the output d1 of the first stage of dividing-2 circuit, the signal REF which determines to fetch the value will be firstly coupled to the data terminal of the first stage of the negative edge trigger D latch of said circuit 602, and the clock terminal is coupled to the output OUT of said controllable oscillator, therefore, the rising edge of sampling phase s1 will be located behind low reference of the output of said controllable oscillator to introduce a time delay and said delay can compensate the delay from the input to output of said dividing-2 circuit. Furthermore, the rising edge of sampling phase s1 will definitely fall between the rising edge of the signal determining to fetch the value and next output rising edge of said controllable oscillator. Hence, by sampling d1 via the sampling phase s1, a correct output value can be obtained. And in this embodiment, the output d4~d8 of said counter 601 are all sampled by said sampling phase s4 since its delay can compensate the delay caused by the transmission of the rising edge signal from d1 transmitted to d4~8.

Figure 8:
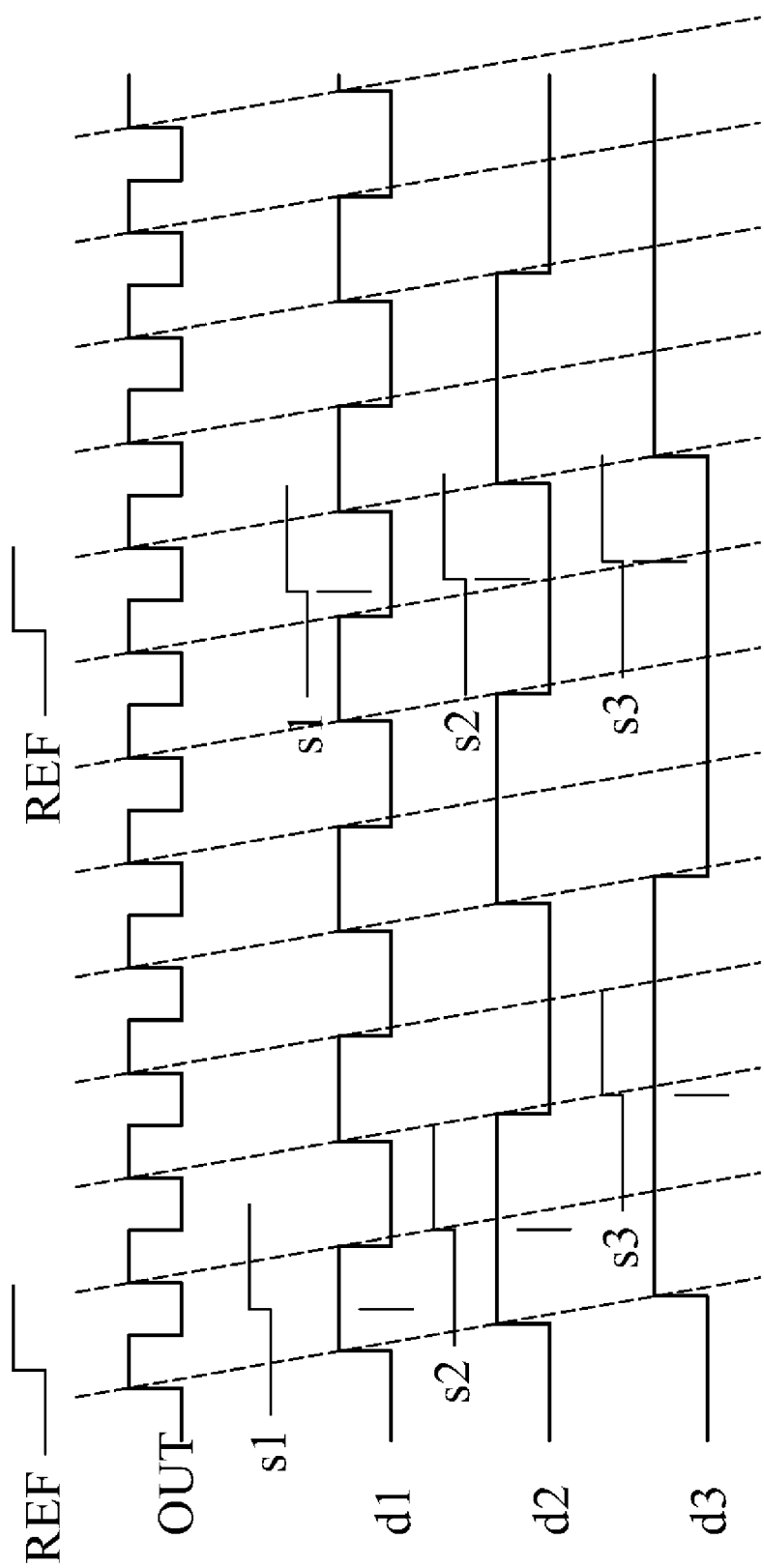
FIG. 8 relates to a clocking diagram of the sampling phase and the asynchronous counter output.

Per the aforementioned techniques, in addition to achieve the goal of high speed and low power consumption based upon the usage of said asynchronous counter 601, the sampling phase generator 602 can follow the delay characteristics of said counter 601 to automatically generate the corresponding sampling phase to retrieve the correct values. The relationship between the bit output of said asynchronous counter and sampling phase is illustrated in FIG. 8.

The invention being thus aforesaid, it will be obvious that the synthesizer may be varied in many ways. Such variations are not to be regarded as a departure from the spirit and scope of the invention, and all such modifications as would be obvious to one skilled in the art are intended to be included within the scope of the following claims.

We claim:

1. A fast-locking digital PLL frequency synthesizer, comprising:
   a loop filter with an automatically-adjusted loop gain, for generating a control signal, and automatically adjusting loop parameters according to a PLL locking procedure;
   a controllable oscillator, coupled to said loop filter, for generating a corresponding oscillating frequency according to said control signal;
   a feedback phase integration circuit, coupled to said controllable oscillator, for estimating a phase information of said controllable oscillator;
   a reference phase integration circuit, for generating a reference phase information; and
   a phase detector, coupled to said loop filter, said feedback phase integration circuit, and said reference phase integration circuit, for comparing the error between the phase of said controllable oscillator and said reference phase;
   wherein said locking procedure is categorized into a first stage and a second stage respectively, and wherein when said locking procedure is at the first stage, said locking procedure comprises the steps of:
   a locking state control circuit generates a control signal for setting a adjustable magnification device on a forward-path to be a predetermined magnification; setting the adjustable magnification device on a integral-path to be zero; and changing its state to be the second stage when the output of said phase detector is within a predetermined range.

2. The frequency synthesizer as set forth in claim 1, wherein said loop filter further comprises:
   an integral-path circuit, coupled to an output terminal of said phase detector, comprising a first adjustable magnification device and an accumulator;
   a forward-path circuit, coupled to said output terminal of said phase detector, comprising a second adjustable magnification device;
   a locking state control circuit, coupled to said integral-path circuit and said phase detector, for generating control signals to respectively control the gain for said first adjustable magnification device and the gain for said second adjustable magnification device; and
   a summing circuit, coupled to said integral-path circuit and said forward path circuit, for generating control signals controlling said oscillator by adding the outputs of said forward-path circuit and said integral-path circuit.

3. A method for fast locking the synthesizer as set forth in claim 2, comprising the steps of:
- at the time of locking, setting the adjustable magnification device on said forward-path to be a predetermined magnification;
- setting the adjustable magnification device on said integral-path to be zero;
- changing the synthesizer's state to be the second stage when the output of said phase detector is within a predetermined range;
- setting the adjustable magnification device at said forward-path circuit to be a predetermined magnification $\beta_0$;
- setting the adjustable magnification device at said integral-path circuit to be another predetermined magnification $\alpha_0$;
- detecting the output $\Phi$ of the integral path circuit;
- recording the average of adjacent local maximum and minimum value to obtain a decision value $\Phi_{avg}$;
- when a difference between the contiguous decision values is smaller than a first critical value $\lambda_1$, and a difference between the present output $\Phi$ of the integral path circuit and the present $\Phi_{avg}$ is smaller than a second critical value $\lambda_2$, then setting the locking state control circuit to be another state to generate the control signal to decrease the gain of the adjustable magnification device at forward-path and the gain of the adjustable magnification device at integral-path and the critical values $\lambda_1$ and $\lambda_2$ are changed accordingly; and
- if the procedure keeps unaltered, the locking state control circuit keeps on generating the control signal, to decrease the gain of the adjustable magnification device at forward-path and the gain of the adjustable magnification device at integral-path and the critical values $\lambda_1$ and $\lambda_2$ are changed accordingly until the gain of the adjustable magnification device at forward-path and the gain of the adjustable magnification device at integral-path are smaller then predetermined values ($\beta_{min}$, $\alpha_{min}$).

4. The frequency synthesizer as set forth in claim 1, when the locking procedure is at the first stage, said locking procedure comprising the steps of:
- the locking state control circuit further generates a control signal to set the adjustable magnification device at said forward-path circuit to be a predetermined magnification $\beta_0$ and to set the adjustable magnification device at said integral-path circuit to be another predetermined magnification $\alpha_0$;
- the locking state control circuit further detects the output $\Phi$ of the integral-path circuit and records the average of the adjacent local maximum and minimum value to obtain a decision value $\Phi_{avg}$;
- when a difference between the contiguous decision values is smaller than a first critical value $\lambda_1$, and a difference between the present output $\Phi$ of the integral-path circuit and the present $\Phi_{avg}$ is smaller than a second critical value $\lambda_2$, then the locking state control circuit enters into another state to generate the control signal to decrease the gain of the adjustable magnification device at forward-path and the gain of the adjustable magnification device at integral-path and the critical values $\lambda_1$ and $\lambda_2$ are changed accordingly; and
- if the procedure keeps unaltered, the locking state control circuit keeps on generating the control signal, to decrease the gain of the adjustable magnification device at forward-path and the gain of the adjustable magnification device at integral-path and the critical values $\lambda_1$ and $\lambda_2$ are changed accordingly until the gain of the adjustable magnification device at forward-path and the gain of the adjustable magnification device at integral-path is as small as a predetermined value ($\beta_{min}$, $\alpha_{min}$).

5. The frequency synthesizer as set forth in claim 1, wherein while said phase detector is operated at the second stage, its output is a binary value ehd 2 according to a polarity of a difference between the feedback phase integration circuit and the reference phase integration circuit.

6. The frequency synthesizer as set forth in claim 1, wherein said feedback phase integration circuit is a L-bit high-speed counter.

7. The frequency synthesizer as set forth in claim 6, wherein said L-bit high-speed counter comprises:
- a L-bit asynchronous counter, comprising L divide-by-2 circuits in serial, each stage of said divide-by-2 circuits is coupled to an output of next divide-by-2 circuit, each bit output of divide-by-2 circuit is coupled to an input of divide-by-2 at next stage;
- a sampling phase generator, for generating a sampling phase corresponding to the output of each stage of divide-by-2 circuits of said asynchronous counter; and
- a L-bit data register, coupled to said L-bit asynchronous counter and said sampling phase generator, for respectively sampling said each bit output of divide-by-2 circuit according to a sampling phase provided by said sampling phase generator to generator a set of sampling results.

8. The frequency synthesizer as set forth in claim 7, wherein said sampling phase generator further comprises N D-latches, and a data side of the $k^{th}$ D-latch is coupled to an output side of the $k-1^{th}$ D-latch, and an inverse clock side of the $k^{th}$ D-latch is coupled to an output side of the $k-1^{th}$ asynchronous counter, and an output side of $k^{th}$ D-latch is coupled to a data side of the $k+1^{th}$ D-latch and a clock side of $k^{th}$ data register.

9. The frequency synthesizer as set forth in claim 8, wherein an output side of the $N^{th}$ D-latch in said L-bit asynchronous counter is coupled to the clock side of higher-than-$(L-N)^{th}$ registers in said L-bit data register.

10. A locking state detecting circuit, coupled to an output of an integration path, comprising:
- a peak detecting circuit, coupled to said output of the integral-path, for recording the peak value of said output of the integral-path;
- a trough detecting circuit, coupled to said output of the integral-path, for recording the trough value of said output of the integral-path;
- a mean circuit, coupled to the output of said peak detecting circuit and that of the trough detecting circuit, for dividing the sum of the output of said peak detecting circuit and that of the trough detecting circuit by two to get an average;
- a differencing circuit, coupled to said mean circuit, for comparing the difference of the outputs of said mean circuit at the contiguous interval; an integral-path value comparing circuit, coupled to said mean circuit and said integral-path, for comparing a difference between a present integral-path value and the mean circuit outputted value, if the absolute value of said difference is smaller than a predetermined first gate value, then a first decision signal is given; and
- a mean comparing circuit, coupled to said differencing circuit, for comparing the absolute value of an output of said differencing circuit, if the absolute value thereof is smaller than a predetermined second gate value, then a second decision signal is given.

* * * * *